US012765236B2

(12) United States Patent
Kim

(10) Patent No.: US 12,765,236 B2
(45) Date of Patent: Oct. 13, 2026

(54) DISPLAY DEVICE INCLUDING A VARIABLE ADHESIVE LAYER

(71) Applicant: LG Display Co., Ltd., Seoul (KR)

(72) Inventor: Kyung-Min Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 119 days.

(21) Appl. No.: 18/906,511

(22) Filed: Oct. 4, 2024

(65) Prior Publication Data

US 2025/0261543 A1 Aug. 14, 2025

(30) Foreign Application Priority Data

Feb. 8, 2024 (KR) ........................ 10-2024-0019878

(51) Int. Cl.
*H10K 59/80* (2023.01)

(52) U.S. Cl.
CPC ......... *H10K 59/873* (2023.02); *H10K 59/877* (2023.02)

(58) Field of Classification Search
CPC ......................... H10K 59/8722; H10K 59/872
See application file for complete search history.

(56) References Cited

U.S. PATENT DOCUMENTS

2005/0191485 A1* 9/2005 Kitano ..................... G02B 5/22 428/354
2013/0158140 A1* 6/2013 Lin ........................ C09D 5/006 521/54
2021/0150945 A1* 5/2021 Youn ..................... G06F 1/1652
2023/0200135 A1* 6/2023 Park ..................... H10K 59/121 257/40
2023/0238176 A1* 7/2023 Chang ...................... C09J 7/403 156/249

FOREIGN PATENT DOCUMENTS

KR 10-2022-0169228 A 12/2022
KR 10-2023-0095622 A 6/2023

* cited by examiner

*Primary Examiner* — Joseph L Williams

(74) *Attorney, Agent, or Firm* — Morgan, Lewis & Bockius LLP

(57) ABSTRACT

A display device may include a display panel which includes an active area including an optical area with a through hole disposed therein and a non-active area enclosing the active area, a cover member disposed on the display panel, a first adhesive layer which is disposed between the display panel and the cover member and includes a variable adhesion material, a base film disposed between the first adhesive layer and the display panel, and a second adhesive layer disposed between the base film and the display panel. Accordingly, a local portion may be easily removed.

9 Claims, 9 Drawing Sheets

DISPLAY DEVICE INCLUDING A VARIABLE ADHESIVE LAYER

CROSS-REFERENCE TO RELATED APPLICATIONS

This application claims the benefit of and priority to Korean Patent Application No. 10-2024-0019878 filed on Feb. 8, 2024, the entire contents of which are incorporated herein by reference for all purposes.

BACKGROUND

1. Technical Field

The present disclosure relates to a display device, and particularly to, for example, without limitation, a display device in which an unevenness of an optical area is improved.

2. Description of the Related Art

As display devices which are used for a monitor of a computer, a television, or a cellular phone, there are an organic light emitting display (OLED) device which is a self-emitting device, a liquid crystal display (LCD) device which requires a separate light source, and the like.

An applicable range of the display device is diversified to include personal digital assistants as well as monitors of computers and televisions and a display device with a large display area and a reduced volume and weight is being studied.

Further, in order to provide more various functions to the users, the display device also provides an optical component, such as a camera and a proximity sensor together. However, the optical device, such as a camera, needs to be exposed to the outside to recognize light so that a display device in which the optical device is disposed by notching a part of the display device or forming a hole in the display device is being developed.

The description of the related art should not be assumed to be prior art merely because it is mentioned in or associated with this section. The description of the related art includes information that describes one or more aspects of the subject technology, and the description in this section does not limit the invention.

SUMMARY

An aspect to be achieved by the present disclosure is to provide a display device in which a damage of an adhesive layer due to a physical punching is minimized.

Another aspect to be achieved by the present disclosure is to provide a display device which minimizes a phenomenon that a band shape of a cut portion of a through hole is visible.

Still another aspect to be achieved by the present disclosure is to provide a display device in which an unevenness of an optical area is improved.

Still another aspect to be achieved by the present disclosure is to provide a display device with an improved reliability and display quality.

Aspects of the present disclosure are not limited to the above-mentioned aspects, and other aspects, which are not mentioned above, can be clearly understood by those skilled in the art from the present disclosure.

According to an aspect of the present disclosure, a display device includes a display panel which includes an active area including an optical area with a through hole disposed therein and a non-active area enclosing the active area, a cover member disposed on the display panel, a first adhesive layer which is disposed between the display panel and the cover member and includes a variable adhesion material, a base film disposed between the first adhesive layer and the display panel, and a second adhesive layer disposed between the base film and the display panel. Accordingly, a local portion may be easily removed.

Other detailed matters of the example embodiments are included in the detailed description and the drawings.

According to the example embodiment of the present disclosure, the adhesive layer is cut using laser to form a through hole so that the phenomenon that a band shape of the cut portion of the through hole is visible may be minimized.

According to the example embodiment of the present disclosure, the adhesive layer includes a variable adhesive material to easily remove a local portion.

According to the example embodiment of the present disclosure, visible recognition of the unevenness of the optical area may be minimized.

According to the example embodiment of the present disclosure, the reliability and the display quality may be improved.

According to the example embodiment of the present disclosure, a potential defect possibility in the display device, such as a poor image quality may be minimized. Therefore, according to the example embodiment, a lifespan of the display device is improved to enable low-power operation in terms of reducing a production energy.

The effects according to the present disclosure are not limited to the contents exemplified above, and more various effects are included in the present specification.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the present disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the present disclosure, are incorporated in and constitute a part of this present disclosure, illustrate aspects and embodiments of the present disclosure, and together with the description serve to explain principles and examples of the disclosure. In the drawings.

Figure 1:
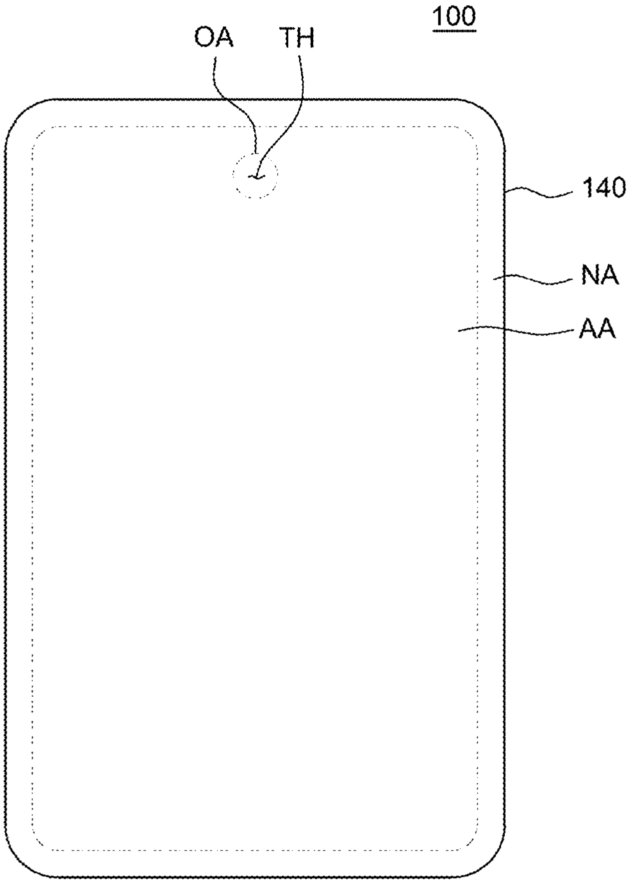
FIG. 1 is a schematic plan view of a display device according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements (e.g., layers, films, components, sections, members, parts, regions, areas, portions, steps, operations, and/or the like), one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. For example, an element may be one or more elements. An element may include a plurality of elements. The word "exemplary" is used to mean serving as an example or illustration. Embodiments are example embodiments. Aspects are example aspects. In one or more implementations, "embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

When a positional relationship between two elements (e.g., layers, films, components, sections, members, parts, regions, areas, portions, and/or the like) are described using any of the terms such as "on," "on a top of," "upon," "on top of," "over," "under," "above," "upper," "at an upper portion," "at a upper side," "below," "lower," "at a lower portion," "at a lower side," "beneath," "near," "close to," "adjacent to," "beside," "next to," "at or on a side of," and/or the like indicating a position or location, one or more other elements may be located between the two elements unless a more limiting term, such as "immediate(ly)," "direct(ly)," or "close(ly)," is used. For example, when an element and another element are described using any of the foregoing terms, this description should be construed as including a case in which the elements contact each other directly as well as a case in which one or more additional elements are disposed or interposed therebetween. Furthermore, the spatially relative terms such as the foregoing terms as well as other terms such as "front," "rear," "back," "left," "right," "top," "bottom," "upper," "lower," "downward," "upward," "up," "down," "column," "row," "vertical," "horizontal," "diagonal," and the like refer to an arbitrary frame of reference. For example, these terms may be used for an example understanding of a relative relationship between elements, including any correlation as shown in the drawings. However, embodiments of the disclosure are not limited thereby or thereto. The spatially relative terms are to be understood as terms including different orientations of the elements in use or in operation in addition to the orientation depicted in the drawings or described herein. For example, where a lower element or an element positioned under another element is overturned, then the element may be termed as an upper element or an element positioned above another element. Thus, for example, the term "under" or "beneath" may encompass, in meaning, the term "above" or "over." An example term "below" or the like, can include all directions, including directions of "below," "above" and diagonal directions. Likewise, an example term "above," "on" or the like can include all directions, including directions of "above," "on," "below" and diagonal directions.

In describing a temporal relationship, when the temporal order is described as, for example, "after," "following," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, components, sections, members, parts, regions, areas, portions, steps, operations, and/or the like), these elements should not be limited by these terms, for example, to any particular order, precedence, or number of elements. These terms are used only to distinguish one element from another. For example, a first element may denote a second element, and, similarly, a second element may denote a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

The expression that an element (e.g., layer, film, component, lens, electrode, filter, section, member, part, region, area, portion, or the like) "is engaged" with another element may be understood, for example, as that the element may be either directly or indirectly engaged with the another element. The term "is engaged" or similar expressions may refer to a term such as "covers," "surrounds," "is in contact," "overlaps," "crosses," "intersects," "is connected," "is coupled," "is attached," "is adhered," "is combined," "is linked," "is provided," "is disposed," "interacts," or the like. The engagement may involve one or more intervening elements disposed or interposed between the element and the another element, unless otherwise specified. Further, the element may be engaged at least partially or entirely (or completely) with the another element, unless otherwise specified. Further, the element may be included in at least one of two or more elements that are engaged with each other. Similarly, the another element may be included in at least one of two or more elements that are engaged with each other. When the element is engaged with the another element, at least a portion of the element may be engaged with at least a portion of the another element. The term "with another element" or similar expressions may be understood as "another element," or "with, to, in, or on another element," as appropriate by the context. Similarly, the term "with each other" may be understood as "each other," or "with, to, or on each other," as appropriate by the context.

The phrase "through" may be understood, for example, to be at least partially through or entirely through.

The terms such as a "line" or "direction" should not be interpreted only based on a geometrical relationship in which the respective lines or directions are parallel, perpendicular, diagonal, or slanted with respect to each other, and may be meant as lines or directions having wider directivities within the range within which the components of the present disclosure may operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements. Further, "at least some," "some," "some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements. Moreover, "at least some portions," "some," "at least some parts," "a portion," "portions," "at least a portion," "at least portions," "a part," "at least a part," "parts," "at least parts," or the like of an element can represent (i) a portion (or a part) of the element, (ii) one or more portions (or parts) of the element, or (iii) the element, or all portions of the element.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

A phrase "substantially the same" or "nearly the same" may indicate a degree of being considered as being equivalent to each other taking into account minute differences due to errors in the manufacturing process.

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in more detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

Figure 2:
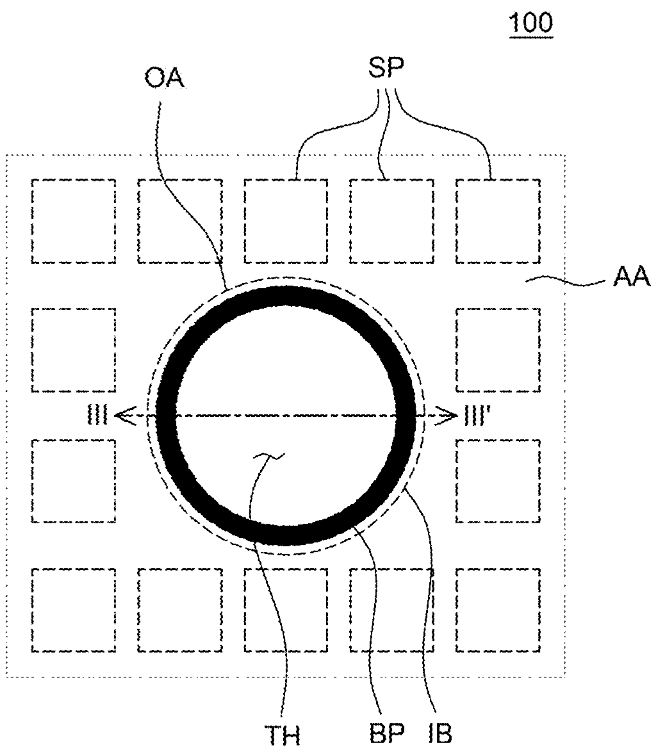
FIG. 2 is an enlarged plan view of a display device according to an example embodiment of the present disclosure.

FIG. 1 is a schematic plan view of a display device according to an example embodiment of the present disclosure. FIG. 2 is an enlarged plan view of a display device according to an example embodiment of the present disclosure. In FIGS. 1 and 2, for the convenience of description, among various components of the display device 100, only a display panel 140 is illustrated.

Referring to FIGS. 1 and 2, the display panel 140 includes an active area AA, a non-active area NA, and an optical area OA.

The active area AA is an area where a plurality of sub pixels SP is disposed to display images. Each of the plurality of sub pixels SP is an individual unit which emits light and in each of the plurality of sub pixels SP, a light emitting diode and a driving circuit are formed. For example, in the plurality of sub pixels SP, a display element for displaying images and a circuit unit for driving the display element may be disposed. For example, when the display device 100 is an organic light emitting display device, the display element may include an organic light emitting display diode and when the display device 100 is a liquid crystal display device, the display element may include a liquid crystal element. The plurality of sub pixels SP may include a red sub pixel, a green sub pixel, a blue sub pixel and/or a white sub pixel, but is not limited thereto.

The non-active area NA is an area where no image is displayed and various wiring lines and driving ICs for driving the plurality of sub pixels SP disposed in the active area AA are disposed therein. For example, in the non-active area NA, various ICs such as a gate driver IC and a data driver IC and driving circuits may be disposed. The non-active area NA in which no image is displayed may also be defined as a bezel area.

In the meantime, the non-active area NA may be defined as an area which encloses the active area AA as illustrated in FIG. 1. However, the non-active area NA may be defined as an area extending from the active area AA or defined as an area in which the plurality of sub pixels SP is not disposed, but it is not limited thereto.

The optical area OA may be disposed in the active area AA. In the active area AA, the optical area OA may be disposed between the plurality of sub pixels SP. The optical area OA is an area in which an optical device, such as a camera or a proximity sensor is disposed. Therefore, the optical area OA may include a through hole TH which passes through some configurations of the display device 100 to dispose the optical device. The through hole TH which passes through the display panel 140 is formed to ensure a space in which the optical device is disposed.

In the meantime, the inner bezel area IB may be disposed so as to enclose the through hole TH. In the inner bezel area IB, a sub pixel SP is not disposed and the inner bezel area IB may be a non-active area NA, like the through hole TH. The inner bezel area IB may be disposed to block a crack which may be generated during a process of forming the through hole TH from permeating the active area AA. Therefore, even though it is not illustrated in the drawing, the inner bezel area IB may include a concave-convex pattern to block permeation of moisture entering from the outside through a cut line and propagation of fine cracks.

Figure 3:
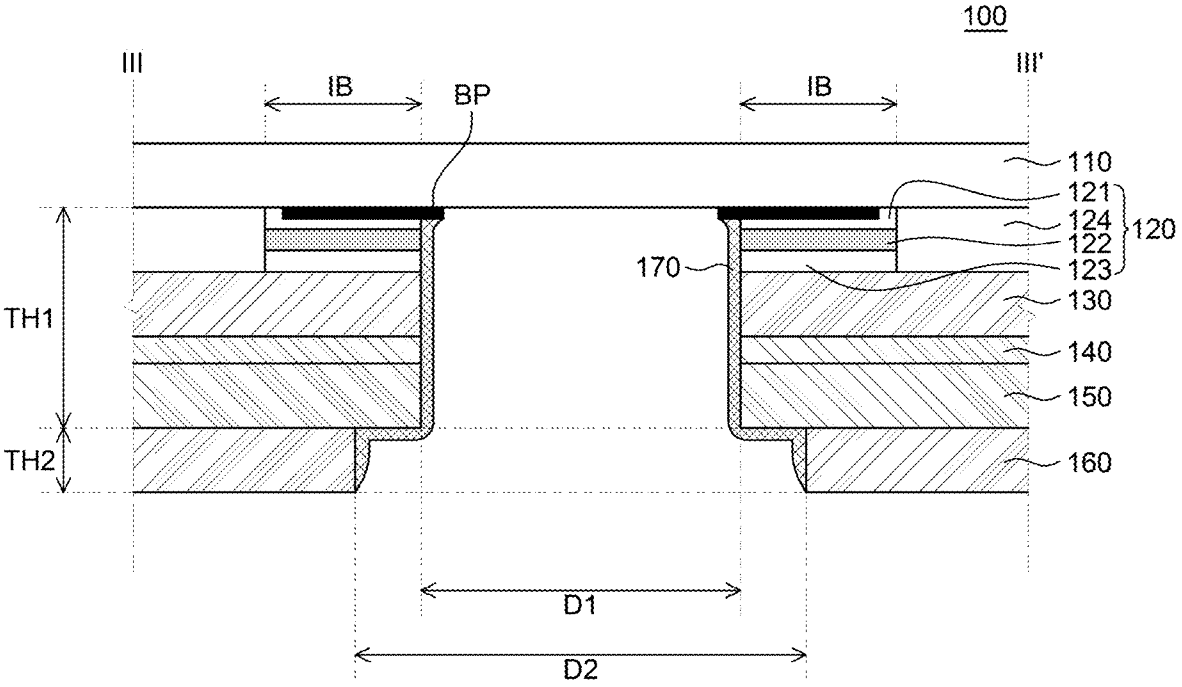
FIG. 3 is a cross-sectional view of a display device according to an example embodiment of the present disclosure.

FIG. 3 is a cross-sectional view of a display device taken along a line III-III' in FIG. 2 according to an example embodiment of the present disclosure.

Referring to FIG. 3, the display device 100 may include a cover member 110, an adhesive layer 120, a polarizer 130, a display panel 140, a support member 150, a conductive member 160, and a conductive light shielding member 170.

First, the display panel 140 may include a substrate and a light emitting diode.

The substrate is a support member for supporting other components disposed on the substrate of the display device 100 and may be configured by an insulating material. For example, the substrate may be formed of glass or resin. Further, the substrate may be configured to include plastics such as polymer or polyimide (PI) or may be formed of a material having a flexibility.

A light emitting diode may be disposed on the substrate. The light emitting diode may be defined in different manners depending on the type of the display panel 140. For example, when the display panel 140 is an organic light emitting display panel, the light emitting diode may be an organic light emitting diode (OLED).

A driving transistor may be disposed between the substrate and the light emitting diode to drive the light emitting diode. The driving transistor may be disposed in each of the plurality of sub pixel areas. For example, the driving transistor includes a gate electrode, an active layer, a source electrode, and a drain electrode. The driving transistor may further include a gate insulating layer which insulates the gate electrode from the active layer and an interlayer insulating layer which insulates the gate electrode from the source electrode and the drain electrode.

The cover member 110 is disposed on the display panel 140. The cover member 110 may protect the polarizer 130 and the display panel 140 disposed below the cover member 110 from external impact, moisture, and heat. The cover member 110 may be formed of a material having an impact resistance and optical transmittance. For example, the cover member 110 may be a substrate formed of glass or a thin film formed of a plastic material such as polymethylmethacrylate (PMMA), polyimide (PI), or polyethylene terephthalate (PET), but is not limited thereto. Further, the cover member 110 is an example terminology, and may be referred to as various terminologies, such as a front member or a cover glass, but is not limited thereto.

The polarizer 130 may be disposed between the cover member 110 and the display panel 140. The polarizer 130 selectively transmits light to reduce the reflection of external light which is incident onto the display panel 140. Specifically, the display panel 140 may include various metal materials applied to a thin film transistor, a wiring line, and an electroluminescent element. Therefore, the external light incident onto the display panel 140 may be reflected from the metal material so that the visibility of the display device 100 may be reduced due to the reflection of the external light. Therefore, the polarizer 130 is disposed on one surface of the display panel 140 to suppress the reflection of the external light and increase an outdoor visibility of the display device 100. However, the components of the display device 100 illustrated in FIG. 3 are illustrative and the polarizer 130 may be omitted depending on an implementation example of the display device 100, but is not limited as illustrated in the drawing.

The adhesive layer 120 may be disposed between the cover member 110 and the polarizer 130. The adhesive layer 120 may bond and fix a component disposed below the cover member 110 and the cover member 110 to each other.

The adhesive layer 120 may include a first adhesive layer 121, a base film 122, a second adhesive layer 123, and a third adhesive layer 124. The first adhesive layer 121, the base film 122, the second adhesive layer 123, and the third adhesive layer 124 are disposed so as to enclose the through hole TH and may be disposed in different areas. For example, the first adhesive layer 121, the base film 122, and the second adhesive layer 123 are disposed to overlap the inner bezel area IB and the third adhesive layer 124 may be disposed to enclose the inner bezel area IB.

The first adhesive layer 121 is disposed between the cover member 110 and the display panel 140 to bond and fix the component disposed below the cover member 110 and the cover member 110. The through hole TH is also formed in the first adhesive layer 121 disposed below the cover member 110 so that the first adhesive layer 121 may include a variable adhesive material which facilitates re-peeling and easy removal of a local portion. That is, the first adhesive layer 121 may be a variable adhesive layer in which an adhesive strength varies according to a specific condition.

The first adhesive layer 121 may include an additive. For example, the first adhesive layer 121 may include an anti-adhesion agent. The anti-adhesion agent may be densely distributed on one surface of the first adhesive layer 121 which is attached to an adherend, before attaching the first adhesive layer 121 and the adherend. After attaching the first adhesive layer 121 and the adherend, the anti-adhesion agent may be evenly distributed inside the first adhesive layer 121 by the intermolecular force. Therefore, the first adhesive layer 121 may exhibit its natural adhesive strength. The anti-adhesion agent may be formed of, for example, a hydrophobic polymer material, but is not limited thereto. The first adhesive layer 121 may be described in more detail with reference to FIGS. 4A to 4E to be described below.

The base film 122 may be disposed below the first adhesive layer 121. The base film 122 is disposed between the first adhesive layer 121 and the second adhesive layer 123 to maintain the shapes of the first adhesive layer 121 and the second adhesive layer 123 by supporting the first adhesive layer 121 and the second adhesive layer 123. For example, the base film 122 is formed of a material, such as polyethylene terephthalate (PET), but is not limited thereto.

The second adhesive layer 123 is disposed below the base film 122 to bond and fix the components disposed below the cover member 110 and the cover member 110 together with the first adhesive layer 121 and the base film 122. The second adhesive layer 123 may be an optically clear adhesive (OCA) which minimizes foreign particles or bubbles generated between the cover member 110 and the polarizer 130, but is not limited thereto. In the meantime, unlike the first adhesive layer 121, the second adhesive layer 123 may not include a variable adhesive material. That is, the adhesive strength of the second adhesive layer 123 is not variable, but fixed.

The third adhesive layer 124 may be disposed on side surfaces of the first adhesive layer 121, the base film 122, and the second adhesive layer 123. The third adhesive layer 124 is disposed in an area other than the inner bezel area IB to bond and fix the cover member 110 and the component disposed below the cover member 110. Therefore, one end of the third adhesive layer 124 may overlap an end of the display panel 140. The third adhesive layer 124 may be an optically clear adhesive (OCA) which minimizes foreign particles or bubbles generated between the cover member 110 and the polarizer 130, but is not limited thereto. In the meantime, unlike the first adhesive layer 121, the third adhesive layer 124 may not include a variable adhesion material. That is, the adhesive strength of the third adhesive layer 124 is not variable, but fixed.

The support member 150 may be disposed below the display panel 140. When the substrate which forms the display panel 140 is formed of a plastic material, such as polyimide, a support substrate formed of glass is disposed below the substrate to perform the manufacturing process of the display device 100 and a component, such as the polarizer, is formed on the display panel 140. Thereafter, the support substrate may be released. However, a component for supporting the substrate is necessary even after releasing the support substrate, so that the support member 150 for supporting the substrate may be disposed below the substrate of the display panel 140. Further, the support member 150 not only supports the display panel 140, but also protects the display panel 140 from external moisture, heat, and impacts. For example, the support member 150 may be a thin film formed of polyimide (PI), polyethylene terephthalate (PET), or polyethylene naphthalate (PEN), but is not limited thereto.

The conductive member 160 may be disposed below the support member 150. The conductive member 160 is formed of a material having an excellent electric conductivity to discharge static electricity generated in the cover member 110 to the outside together with the conductive light shielding member 170. Further, the conductive member 160 may serve as a heat dissipation member which discharges heat generated while driving the display device 100. To this end, the conductive member 160 may be formed of a material having excellent heat conductivity and electric conductivity, and for example, copper (Cu) or graphite, but is not limited thereto.

Further, the conductive member 160 may protect and support the component on the conductive member 160. The conductive member 160 is formed of a rigid material to minimize dents, etc. caused by the external impact.

In the meantime, in the present disclosure, the configurations disposed below the display panel 140 are referred to as the support member 150 and the conductive member 160, but the support member 150 and the conductive member 160 may be referred to as other terminologies. For example, the conductive member 160 may be referred to as a first member or a first plate and the support member 150 may be referred to as a second member or a second plate, but are not limited thereto.

A through hole TH may be formed in the remaining configurations other than the cover member 110, among configurations of the display device 100. The through hole TH may be formed by passing through the adhesive layer 120, the polarizer 130, the display panel 140, the support member 150, and the conductive member 160. That is, the adhesive layer 120, the polarizer 130, the display panel 140, the support member 150, and the conductive member 160 may be disposed so as to enclose the through hole TH. The through hole TH is an empty space for placing an optical device, such as a camera, in the active area AA. The optical device may be disposed in the through hole TH to recognize an external environment at the outside of the cover member 110. The optical device may operate by recognizing external light which is transmitted to the optical device through the cover member 110. At this time, the through hole TH is not formed in the cover member 110 to suppress the permeation of foreign particles to the through hole TH.

In the meantime, a size of the through hole TH of the conductive member 160 may be different depending on an order of an attaching process of the conductive member 160 and a forming process of the through hole TH. Hereinafter, for the convenience of description, a through hole TH which is continuously formed in the adhesive layer 120, the polarizer 130, the display panel 140, and the support member 150, that is, the through hole TH disposed along the adhesive layer 120, the polarizer 130, the display panel 140, and the support member 150 is referred to as a first through hole TH1. A through hole TH formed in the conductive member 160 is referred to as a second through hole TH2. However, the first through hole TH1 and the second through hole TH2 are illustrative so that the first through hole TH1 may be referred to as a first hole and the second through hole TH2 may be referred to as a second hole, but are not limited thereto.

For example, referring to FIG. 3, the first through hole TH1 having a first diameter D1 is formed in the adhesive layer 120, the polarizer 130, the display panel 140, and the support member 150 at one time. Thereafter, the conductive member 160 with the second through hole TH2 having a second diameter D2 formed therein may be attached on a rear surface of the support member 150. At this time, the first diameter D1 of the first through hole TH1 may be smaller than the second diameter D2 of the second through hole TH2. If the second through hole TH2 is smaller than the first through hole TH1, when the conductive member 160 is attached, it may be difficult to align the second through hole TH2 and the first through hole TH1. Further, it may be difficult to form the conductive light shielding member 170 to be described below in the first through hole TH1. Accordingly, when the through hole TH is formed before attaching the conductive member 160, the adhesive layer 120, the polarizer 130, the display panel 140, and the support member 150 with the first through hole TH1 and the conductive member 160 with the second through hole TH2 having a diameter larger than that of the first through hole TH1 are attached to manufacture the display device 100.

In the meantime, even though it is not illustrated, the through hole TH may be formed after attaching the adhesive layer 120, the polarizer 130, the display panel 140, and the support member 150 with the conductive member 160. In this case, a diameter of the first through hole TH1 formed in the adhesive layer 120, the polarizer 130, the display panel 140, and the support member 150 may be the same as the diameter of the second through hole TH2 formed in the conductive member 160. However, the sizes of the through hole TH formed in the adhesive layer 120, the polarizer 130, the display panel 140, the support member 150, and the conductive member 160 may be configured in various sizes, but are not limited thereto.

The light shielding member 170 is disposed in the through hole TH. The light shielding member 170 is formed of a material having a conductivity to be referred to as a conductive light shielding member 170. The conductive light shielding member 170 may block light of the display panel 40 from entering inside the through hole TH and discharge static electricity generated from the cover member 110. The conductive light shielding member 170 may cover a part of the cover member 110, a side surface of the adhesive layer 120, a side surface of the polarizer 130, a side surface of the display panel 140, a side surface of the support member 150, and a side surface of the conductive member 160 which are exposed through the through hole TH. The conductive light shielding member 170 may be disposed so as to cover an inner circumferential surface of the through hole TH and a part of the rear surface of the cover member 110 corresponding to the circumference of the through hole TH. One end of the conductive light shielding member 170 may be disposed on the cover member 110 and the other end may be in contact with the conductive member 160. The conductive light shielding member 170 may overlap a part of the conductive member 160.

For example, referring to FIG. 3, the conductive light shielding member 170 may cover a rear surface of the cover member 110, a boundary portion between the rear surface of the cover member 110 and a side surface of the adhesive layer 120, a side surface of the adhesive layer 120, a side surface of the polarizer 130, a side surface of the display panel 140, and a side surface of the support member 150. The conductive light shielding member 170 may cover the rear surface of the support member 150, the boundary portion of the rear surface of the support member 150 and a side surface of the conductive member 160, and a side surface of the conductive member 160 which are exposed through the second through hole TH2. Therefore, when the second through hole TH2 of the conductive member 160 is larger than the first through hole TH1 of the adhesive layer 120, the polarizer 130, the display panel 140, and the support member 150, the conductive light shielding member 170 may also cover a part of the support member 150 which is exposed through the second through hole TH2.

In the meantime, even though it is not illustrated in the drawing, when the first diameter D1 and the second diameter D2 are equal, the conductive light shielding member 170 may cover a rear surface of the cover member 110, a boundary portion between the rear surface of the cover member 110 and a side surface of the adhesive layer 120, a side surface of the adhesive layer 120, a side surface of the polarizer 130, a side surface of the display panel 140, a side surface of the support member 150, and a side surface of the conductive member 160.

The conductive light shielding member 170 may be formed of a material which is opaque and has an electric conductivity to suppress the light leakage and discharge static electricity. The conductive light shielding member 170 may be formed of a conductive ink or a conductive paste and for example, a conductive ink in which conductive particles such as carbon black or a conductive polymer such as PEDOT:PSS (poly(3,4-ethylenedioxythiophene)) are mixed or a conductive paste formed of a material such as silver. Further, the conductive light shielding member 170 may have a resistance of 0 to 10^6Ω to discharge the static electricity. The conductive light shielding member 170 may be formed of various materials other than the above-described materials, but is not limited thereto.

However, an end portion of the conductive light shielding member 170 may be disposed on a printed pattern BP in an area corresponding to the first through hole TH1. Specifically, in the area corresponding to the first through hole TH1, the end portion of the conductive light shielding member 170 may be disposed on the rear surface of the printed pattern BP. As the end portion of the conductive light shielding member 170 is disposed on the rear surface of the printed pattern BP, in an area corresponding to the first through hole TH1, the printed pattern BP and the conductive light shielding member 170 are in contact with each other. Electrostatic discharge (ESD) charges generated in the cover member 110 may be discharged starting from the printed pattern BP via the conductive light shielding member 170, by this contact.

The printed pattern BP may be disposed between the cover member 110 and the conductive light shielding member 170. For example, the printed pattern BP may be disposed along the circumference of the through hole TH on the rear surface of the cover member 110. At least one of the first through hole TH1 and the second through hole TH2 may overlap the printed pattern BP.

At this time, the printed pattern BP may discharge the static electricity generated in the cover member 110 to the conductive member 160, together with the conductive light shielding member 170. The printed pattern BP may be formed of an insulating material or a conductive material, such as the conductive light shielding member 170 and for example, may be formed of a black ink or an ink or a silver paste including a conductive material. At this time, even though the printed pattern BP is formed of an insulating material and the conductive light shielding member 170 is indirectly connected to the cover member 110 by means of the printed pattern BP, the printed pattern may easily discharge the static electricity generated in the cover member 110. In the meantime, in the present disclosure, even though the configuration formed on the rear surface of the cover member 110 is referred to as the printed pattern BP, the printed pattern BP may be referred to as a pattern, but is not limited thereto. In the meantime, the printed pattern BP may be disposed so as to overlap the entire rear surface of the cover member 110, but is not limited as illustrated in the drawing.

Hereinafter, a method of manufacturing a display device according to an example embodiment of the present disclosure will be described with reference to FIGS. 4A to 4E.

FIGS. 4A to 4E are process diagrams for explaining a method of manufacturing a display device according to an example embodiment of the present disclosure. In FIGS. 4A to 4E, for the convenience of description, the printed pattern BP is not illustrated.

Figure 4A:
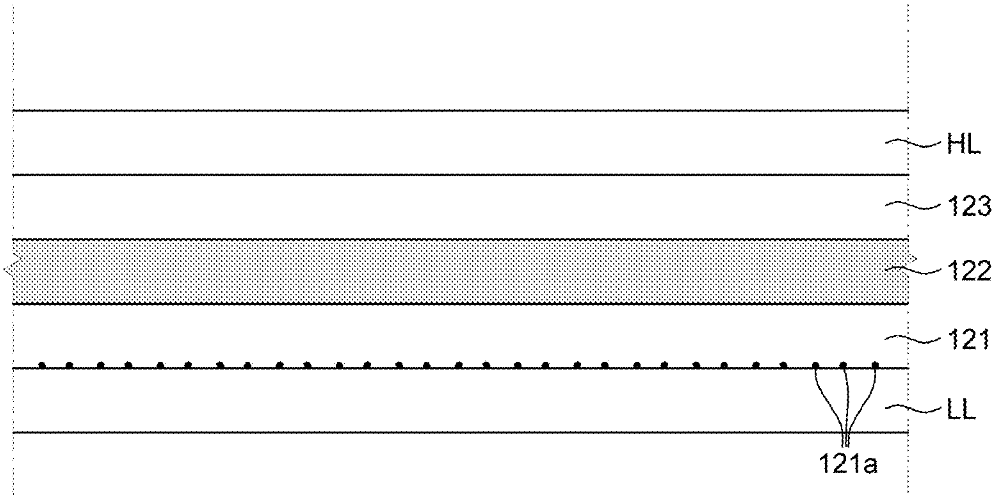
FIGS. 4A to 4E are process diagrams for explaining a method of manufacturing a display device according to an example embodiment of the present disclosure.

First, referring to FIG. 4A, a first liner LL may be attached onto one surface of the first adhesive layer 121 and a second liner HL may be attached onto one surface of the second adhesive layer 123. The first liner LL and the second line HL may protect the first adhesive layer 121, the base film 122, and the second adhesive layer 123. When the first adhesive layer 121 and the second adhesive layer 123 are attached to a component of the display device 100, the first liner LL and the second liner HL may be peeled so that one surfaces of the first adhesive layer 121 and the second adhesive layer 123 are in contact with an adherend.

In the meantime, before attaching the first adhesive layer 121 and the first liner LL, a coating process may be performed to densely dispose the anti-adhesion agent 121*a* in the first adhesive layer 121 on one surface onto which the first liner LL is attached. Even though the first liner LL is peeled to be attached onto the adherend, the anti-adhesion agent 121*a* is densely distributed on one surface of the first adhesive layer 121 to which the adherend is attached so that the adhesive strength may be relatively low in the initial stage of the attachment.

Figure 4B:
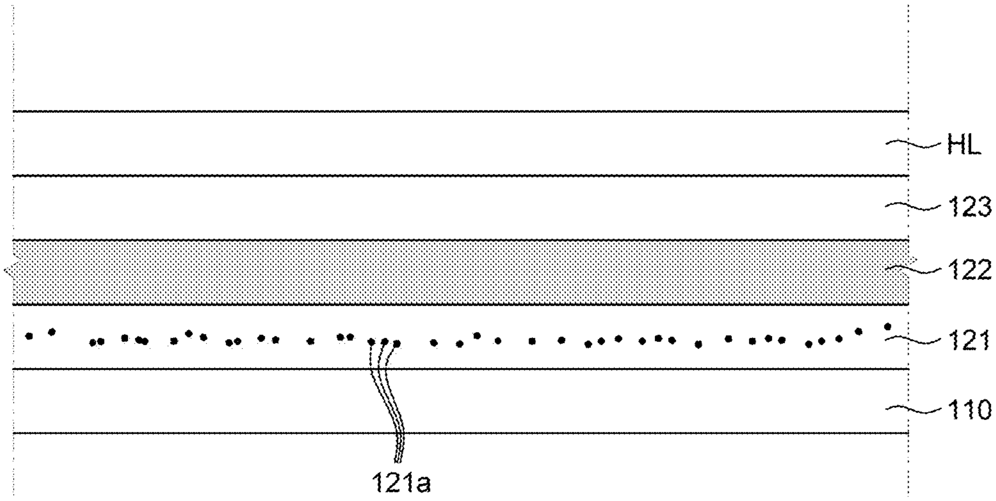

Next, referring to FIG. 4B, a process may be performed in which the first liner LL is peeled and the cover member 110 which is an adherend is attached onto one surface of the first adhesive layer 121. When the cover member 110 is attached onto one surface of the first adhesive layer 121, the anti-adhesion agent 121*a* which hinders the adhesive strength may be distributed into the first adhesive layer 121 on one surface of the first adhesive layer 121 by the intermolecular force. Therefore, the number of anti-adhesion agents 121*a* which is distributed on one surface of the first adhesive layer 121 to which the cover member 110 is attached may be significantly reduced. Accordingly, the first adhesive layer 121 may exhibit its natural adhesive strength.

Figure 4C:
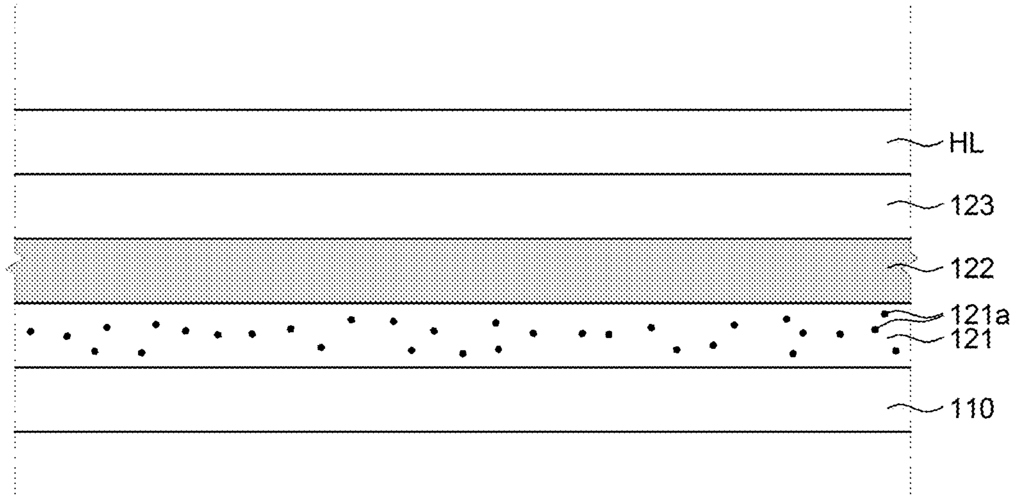

Next, referring to FIG. 4C, a heating process of the first adhesive layer 121 may be performed. When the first adhesive layer 121 is heated, a moving speed of the anti-adhesion agent 121*a* in the first adhesive layer 121 is increased to be uniformly distributed on the entire first adhesive layer 121 at a high speed. Therefore, its natural adhesive strength of the first adhesive layer 121 is ensured in a short time so that the process time may be shortened. The heating process of the first adhesive layer 121 may be performed, for example, at 50° C. to 80° C., but is not limited thereto.

Figure 4D:
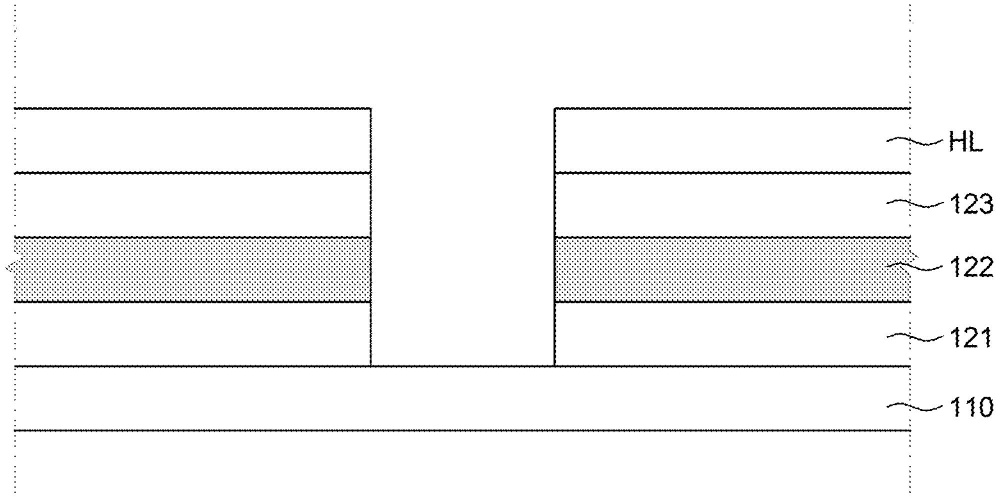

Next, referring to FIG. 4D, a cutting process of the first adhesive layer 121, the base film 122, the second adhesive layer 123, and the second liner HL may be performed. That is, the first adhesive layer 121, the base film 122, and the second adhesive layer 123 may be cut while being attached to the cover member 110. For example, in order to minimize waviness phenomenon that a band shape of the cut portion is visible due to an external force, a laser cutting process may be performed as the cutting process.

Figure 4E:
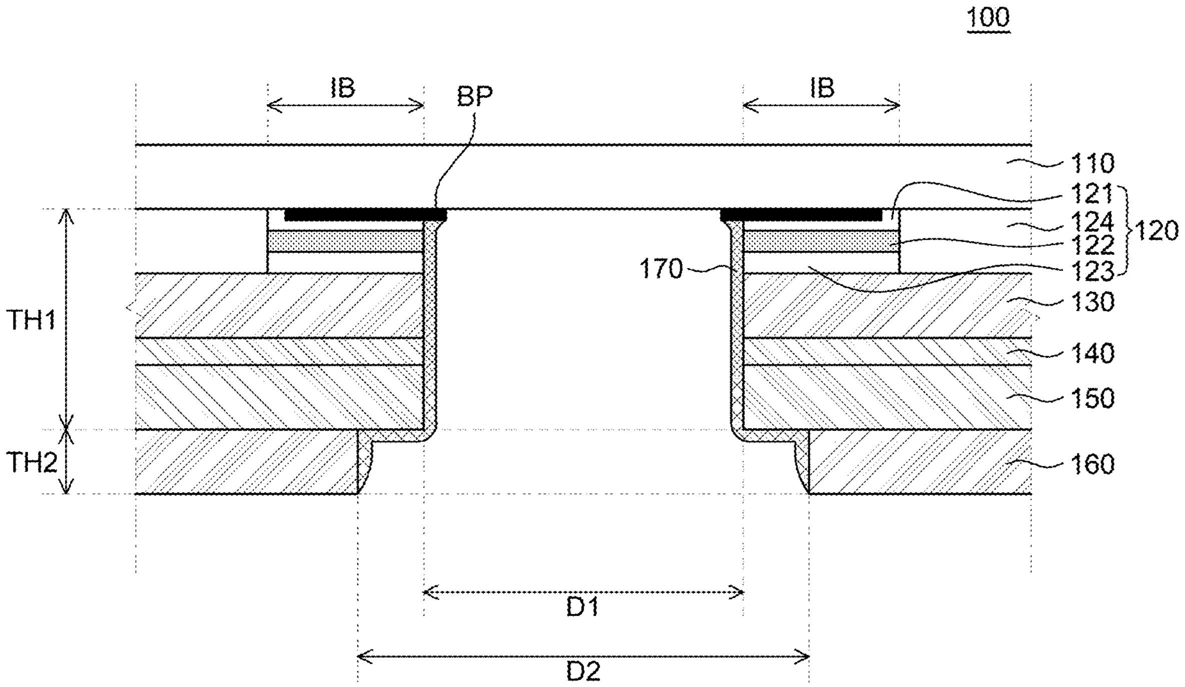

Next, referring to FIG. 4E, the peeling process of the second liner HL, the attaching process of the third adhesive layer 124, the polarizer 130, the display panel 140, the support member 150, and the conductive member 160, and the placement process of the conductive light shielding member 170 may be sequentially performed.

In the meantime, the display device has an active area in which images are substantially displayed and a bezel area which is a non-active area which is blocked by a light shielding member so that images are not substantially displayed. In the active area, a display element is disposed to display images and in the bezel area, various wiring lines or driving circuits for driving the display element are disposed. The display device includes a camera, a speaker, a microphone, and various sensors to provide various functions and these components are also disposed in the bezel area.

In recent years, in order to make a design of the display device beautiful and provide a larger screen in a limited size of the display device as large as possible, studies to reduce the bezel area are actively being conducted. In accordance with this, components, such as a camera, a speaker, a microphone, or a sensor, which have been disposed in the bezel area in the related art are disposed in the active area, but in order to smoothly display images, a technique which disposes the components on a rear surface of the display panel is being proposed.

However, the optical device, such as a camera, needs to be exposed to the outside to recognize light so that a display device in which the optical device is disposed by notching a part of the display device or forming a hole in the display device is being developed.

For example, among various configurations of the display device, the remaining configuration other than the cover member is locally removed to form a through hole. Therefore, an adhesive layer which is disposed between various configurations may also be locally removed to protect various configurations from the external force and fix various configurations. For example, in order to locally remove the adhesive layer, a punching process by a physical external force using a punching tool may be performed. At this time, a depth of the punching tool needs to be controlled in accordance with a cut area and when the depth is erroneously controlled, an external force to be applied to the adhesive layer may be increased. Therefore, the waviness phenomenon that a band-shaped unevenness is visible along the cut area may occur.

Further, in the process of attaching the adhesive layer, a defect occurs so that the adhesive layer needs to be peeled to remove the adhesive layer. At this time, it may be difficult to remove the adhesive due to a high adhesive strength of the adhesive layer so that it is difficult to reuse the display device.

In the display device 100 according to the example embodiment of the present disclosure, in order to transmit the light through the optical device disposed below the display panel 140, a through hole TH may be formed in a component disposed below the cover member 110. Simultaneously, the adhesive layer 120 may be disposed between the cover member 110 and the display panel 140. Among them, the first adhesive layer 121 may be disposed to correspond to the optical area OA in which the through hole TH is disposed and for example, may be disposed in the inner bezel area IB. At this time, the first adhesive layer 121 may include a variable adhesion material. That is, the first adhesive layer 121 may be a variable adhesive layer which is easily locally removed and re-peeled. Therefore, the through hole TH of the first adhesive layer 121 may be easily formed.

Further, in the display device 100 according to the example embodiment of the present disclosure, the through hole TH of the first adhesive layer 121 may be formed by a laser cutting process. Therefore, in the first adhesive layer 121, the waviness phenomenon that the band-shape of the cut portion due to the physical external force is visible may be minimized. Therefore, in the display device 100 according to the example embodiment of the present disclosure, unevenness which is generated in the vicinity of the through hole TH to be visible to the user may be suppressed. Therefore, the display quality in a surrounding area of the through hole TH may be improved.

Figure 5:
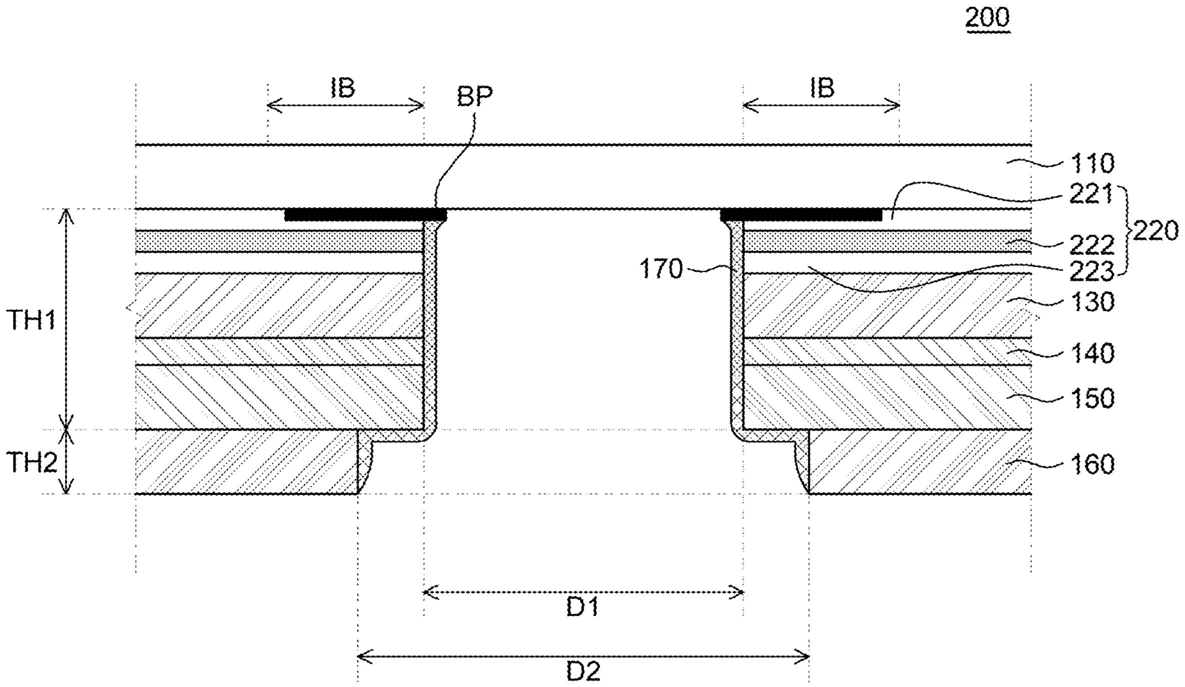
FIG. 5 is a cross-sectional view of a display device according to another example embodiment of the present disclosure.

FIG. 5 is a cross-sectional view of a display device according to another example embodiment of the present disclosure. The only difference between a display device 200 of FIG. 5 and the display device 100 of FIGS. 1 to 4E is an adhesive layer 220, but the other component is substantially the same, so that a redundant description will be omitted.

Referring to FIG. 5, the adhesive layer 220 may be disposed between the cover member 110 and the polarizer 130. The adhesive layer 220 may bond and fix a component disposed below the cover member 110 and the cover member 110 to each other.

The adhesive layer 220 may include a first adhesive layer 221, a base film 222, and a second adhesive layer 223.

The first adhesive layer 221 is disposed between the cover member 110 and the display panel 140 to bond and fix the component disposed below the cover member 110 and the cover member 110. The first adhesive layer 221 disposed below the cover member 110 also has a through hole TH so that the first adhesive 221 may include a variable adhesive material which facilitates re-peeling and easy removal of a local portion. That is, the first adhesive layer 221 may be a variable adhesive layer in which an adhesive strength varies according to a specific condition.

The first adhesive layer 221 may include an additive. For example, the first adhesive layer 221 may include an anti-adhesion agent. The anti-adhesion agent may be densely distributed on one surface of the first adhesive layer 221 which is attached to an adherend, before attaching the first adhesive layer 221 and the adherend. After attaching the first adhesive layer 221 and the adherend, the anti-adhesion agent may be evenly distributed inside the first adhesive layer 221 by the intermolecular force. Therefore, the first adhesive layer 221 may exhibit its natural adhesive strength. The anti-adhesion agent may be formed of, for example, a hydrophobic polymer material, but is not limited thereto.

A base film 222 may be disposed below the first adhesive layer 221. The base film 222 is disposed between the first adhesive layer 221 and the second adhesive layer 223 to maintain the shapes of the first adhesive layer and the second adhesive layer by supporting the first adhesive layer 221 and the second adhesive layer 223. For example, the base film 222 may be formed of a material, such as polyethylene terephthalate (PET), but is not limited thereto.

The second adhesive layer 223 is disposed below the base film 222 to bond and fix the components disposed below the cover member 110 and the cover member 110 together with the first adhesive layer 221 and the base film 222. The second adhesive layer 223 may be an optically clear adhesive (OCA) which minimizes foreign particles or bubbles generated between the cover member 110 and the polarizer 130, but is not limited thereto. In the meantime, unlike the first adhesive layer 221, the second adhesive layer 223 may not include a variable adhesive material. That is, the adhesive strength of the second adhesive layer 223 may not be variable, but may be fixed.

In the meantime, the adhesive layer 220 may be configured by the same layer on the front surface of an area corresponding to the display panel 140. That is, the adhesive layer 220 may be configured by the same layer in both the optical area OA and an area enclosing the optical area OA. Specifically, the adhesive layer 220 having the same laminated structure may be disposed not only in an area overlapping the inner bezel area IB, but also the active area AA and the non-active area NA which enclose the inner bezel area IB. Therefore, one ends of the first adhesive layer 221, the base film 222, and the second adhesive layer 223 may overlap a boundary of the inner bezel area IB and the other ends may overlap an end of the display panel 140.

In the display device 200 according to another example embodiment of the present disclosure, in order to transmit the light through the optical device disposed below the display panel 140, a through hole TH may be formed in a component disposed below the cover member 110. Simultaneously, the adhesive layer 220 may be disposed between the cover member 110 and the display panel 140. A placement area of the adhesive layer 220 may overlap the front surface of the display panel 140. Therefore, the adhesive layer 220 may overlap the inner bezel area IB which encloses the through hole TH. At this time, the first adhesive layer 221 may include a variable adhesion material. That is, the first adhesive layer 221 may be a variable adhesive layer which is easily locally removed and re-peeled. Therefore, the through hole TH of the first adhesive layer 221 may be easily formed.

Further, in the display device 200 according to another example embodiment of the present disclosure, the through hole TH of the first adhesive layer 221 may be formed by a laser cutting process. Therefore, in the first adhesive layer 221, the waviness phenomenon that the band-shape of the cut portion due to the physical external force is visible may be minimized. Therefore, in the display device 200 according to another example embodiment of the present disclosure, unevenness which is generated in the vicinity of the through hole TH to be visible to the user may be suppressed. Accordingly, the display quality in a surrounding area of the through hole TH may be improved.

In the display device 200 according to another example embodiment of the present disclosure, the adhesive layer 220 including the first adhesive layer 221 which is a variable adhesive layer may be configured as the same layer on the front surface of the area corresponding to the display panel 140. That is, the adhesive layer 220 may be configured by the same layer in both the optical area OA and an area enclosing the optical area OA. Specifically, the adhesive layer 220 having the same laminated structure may be disposed not only in an area overlapping the inner bezel area IB, but also the active area AA and the non-active area NA which enclose the inner bezel area IB. That is, in the display device 200 according to another example embodiment of the present disclosure, in order to minimize waviness phenomenon in the vicinity of the through hole TH, the optical area OA including the inner bezel area IB and the remaining area other than the optical area OA are distinguished. Therefore, a separate adhesive layer 220 may not be provided. Therefore, a process of forming and attaching a separate adhesive layer 220 for every area is omitted, but the waviness phenomenon in the vicinity of the through hole TH may be minimized. Accordingly, the manufacturing cost and time are saved so that the process efficiency may be improved.

Figure 6:
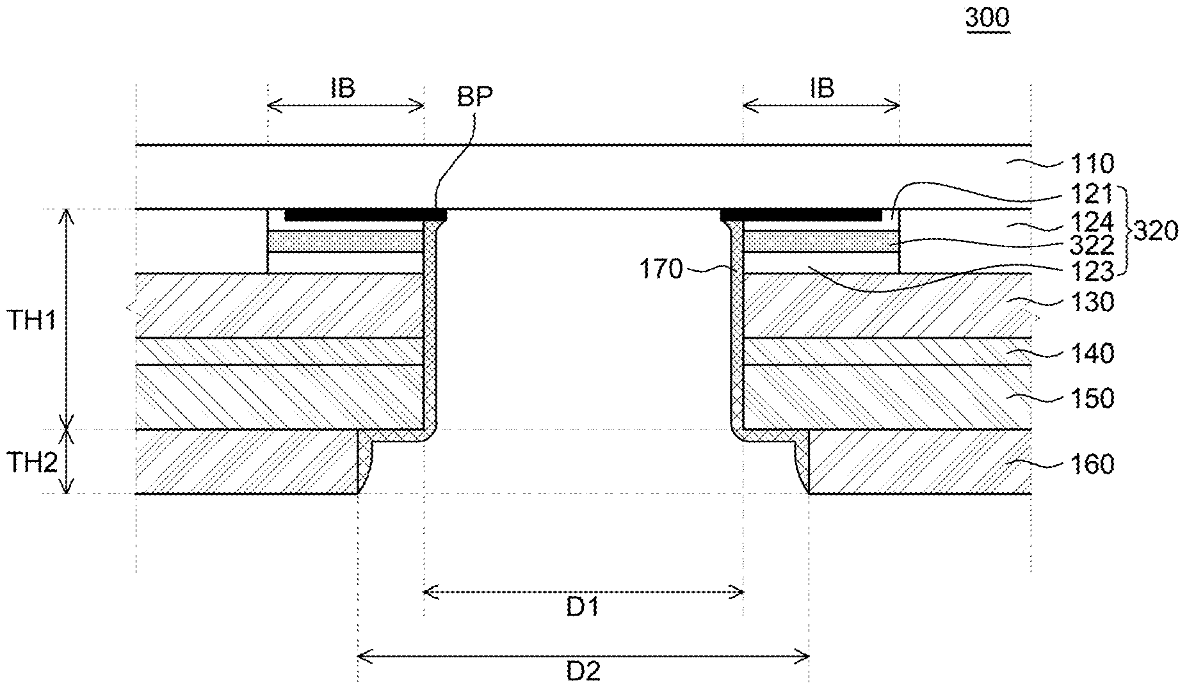
FIG. 6 is a cross-sectional view of a display device according to still another example embodiment of the present disclosure.

FIG. 6 is a cross-sectional view of a display device according to still another example embodiment of the present disclosure. The only difference between a display device 300 of FIG. 6 and the display device 100 of FIGS. 1 to 4E is an adhesive layer 320, but the other component is substantially the same, so that a redundant description will be omitted.

Referring to FIG. 6, a base film 322 may be disposed below the first adhesive layer 121. The base film 322 is disposed between the first adhesive layer 121 and the second adhesive layer 123 to maintain the shapes of the first adhesive layer 121 and the second adhesive layer 123 by supporting the first adhesive layer 121 and the second adhesive layer 123. For example, the base film 322 may be formed of a material, such as polyethylene terephthalate (PET), but is not limited thereto.

The base film 322 may include scattering particles to improve a light extraction efficiency. The scattering particles of the base film 322 scatter light which is totally reflected at an interface of the first adhesive layer 121 and the base film 322 according to a refractive index to be directed to the cover member 110. The scattering particles may be nano-sized spherical inorganic oxide particles having a light scattering property. The scattering particles may be, for example, one of titanium dioxide ($TiO2$) particles, silicon dioxide ($SiO2$) particles, zinc oxide ($ZnO$) particles, and aluminum oxide ($AlO4$) particles, but are not limited thereto. Further, the scattering particles may be spherical, porous, or fibrous, but are not limited thereto.

In the display device 300 according to still another example embodiment of the present disclosure, in order to transmit the light through the optical device disposed below the display panel 140, a through hole TH may be formed in a component disposed below the cover member 110. Simultaneously, the adhesive layer 120 may be disposed between the cover member 110 and the display panel 140. Among them, the first adhesive layer 121 may be disposed to correspond to the optical area OA in which the through hole TH is disposed and for example, may be disposed in the inner bezel area IB. At this time, the first adhesive layer 121 may include a variable adhesion material. That is, the first adhesive layer 121 may be a variable adhesive layer which is easily locally removed and re-peeled. Therefore, the through hole TH of the first adhesive layer 121 may be easily formed.

Further, in the display device 300 according to still another example embodiment of the present disclosure, the through hole TH of the first adhesive layer 121 may be formed by a laser cutting process. Therefore, in the first adhesive layer 121, the waviness phenomenon that the band-shape of the cut portion due to the physical external force is visible may be minimized. Therefore, in the display device 300 according to still another example embodiment of the present disclosure, unevenness which is generated in the vicinity of the through hole TH to be visible to the user may be suppressed. Accordingly, the display quality in a surrounding area of the through hole TH may be improved.

Specifically, in the display device 300 according to still another example embodiment of the present disclosure, the base film 322 of the adhesive layer 320 includes the scattering particles. Therefore, light emitted from the light emitting diode of the display panel 140 is reflected or scatted by the scattering particles of the base film 322 to improve light extraction efficiency.

Figure 7:
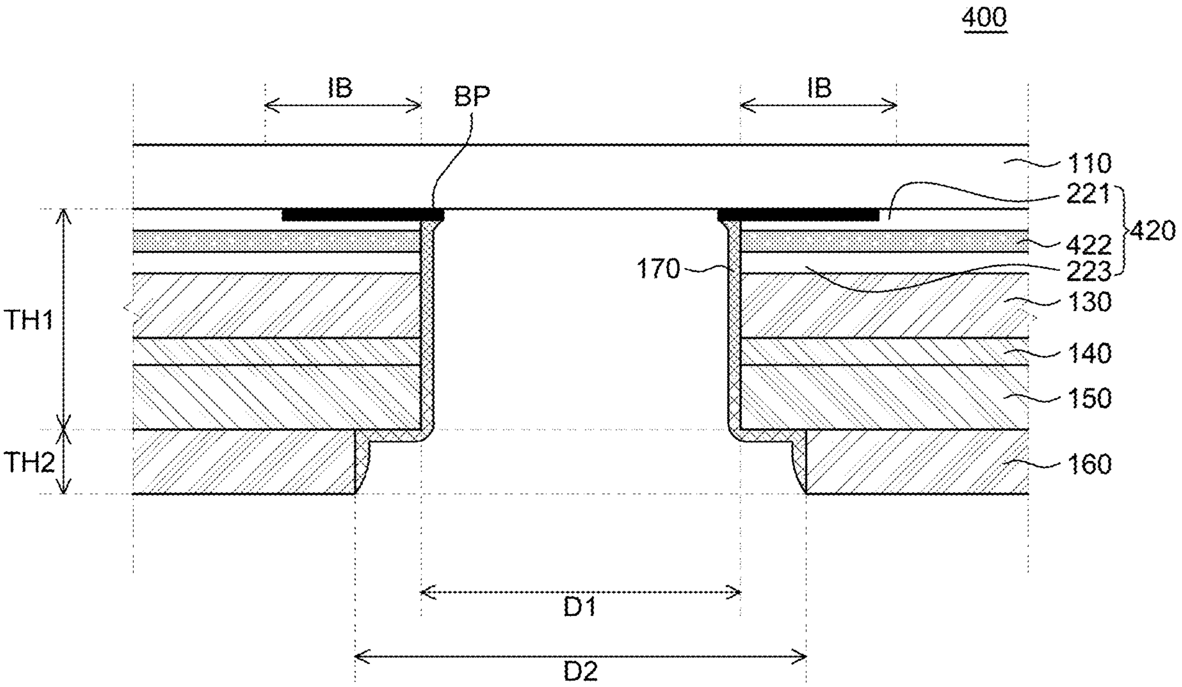
FIG. 7 is a cross-sectional view of a display device according to still another example embodiment of the present disclosure.

FIG. 7 is a cross-sectional view of a display device according to still another example embodiment of the present disclosure. As compared with the display device 200 of FIG. 5, only an adhesive layer 420 of FIG. 7 is different, but the other components are substantially the same, so that a redundant description will be omitted.

Referring to FIG. 7, a base film 422 may be disposed below the first adhesive layer 221. The base film 422 is disposed between the first adhesive layer 221 and the second adhesive layer 223 to maintain the shapes of the first adhesive layer 221 and the second adhesive layer 223 by supporting the first adhesive layer 221 and the second adhesive layer 223. For example, the base film 422 may be formed of a material, such as polyethylene terephthalate (PET), but is not limited thereto.

The base film 422 may include scattering particles to improve a light extraction efficiency. The scattering particles of the base film 422 scatter light which is totally reflected at an interface of the first adhesive layer 221 and the base film 422 according to a refractive index to be directed to the cover member 110. The scattering particles may be nano-sized spherical inorganic oxide particles having a light scattering property. The scattering particles may be, for example, one of titanium dioxide (TiO2) particles, silicon dioxide (SiO2) particles, zinc oxide (ZnO) particles, and aluminum oxide (AlO4) particles, but are not limited thereto. Further, the scattering particles may be spherical, porous, or fibrous, but are not limited thereto.

In the display device 400 according to still another example embodiment of the present disclosure, in order to transmit the light through the optical device disposed below the display panel 140, a through hole TH may be formed in a component disposed below the cover member 110. Simultaneously, the adhesive layer 420 may be disposed between the cover member 110 and the display panel 140. A placement area of the adhesive layer 420 may overlap the front surface of the display panel 140. Therefore, the adhesive layer 420 may overlap the inner bezel area IB which encloses the through hole TH. At this time, the first adhesive layer 221 may include a variable adhesion material. That is, the first adhesive layer 221 may be a variable adhesive layer which is easily locally removed and re-peeled. Therefore, the through hole TH of the first adhesive layer 221 may be easily formed.

Further, in the display device 400 according to still another example embodiment of the present disclosure, the through hole TH of the first adhesive layer 221 may be formed by a laser cutting process. Therefore, in the first adhesive layer 221, the waviness phenomenon that the band-shape of the cut portion due to the physical external force is visible may be minimized. Therefore, in the display device 400 according to still another example embodiment of the present disclosure, unevenness which is generated in the vicinity of the through hole TH to be visible to the user may be suppressed. Accordingly, the display quality in a surrounding area of the through hole TH may be improved.

In the display device 400 according to still another example embodiment of the present disclosure, the adhesive layer 420 including the first adhesive layer 221 which is a variable adhesive layer may be configured as the same layer on the front surface of the area corresponding to the display panel 140. That is, the adhesive layer 420 may be configured by the same layer in both the optical area OA and an area enclosing the optical area OA. Specifically, the adhesive layer 420 having the same laminated structure may be disposed not only in an area overlapping the inner bezel area IB, but also the active area AA and the non-active area NA which enclose the inner bezel area IB. That is, in the display device 400 according to another example embodiment of the present disclosure, in order to minimize waviness phenomenon in the vicinity of the through hole TH, the optical area OA including the inner bezel area IB and the remaining area other than the optical area OA are distinguished. Therefore, a separate adhesive layer 420 may not be provided. Therefore, a process of forming and attaching a separate adhesive layer 420 for every area is omitted, but the waviness phenomenon in the vicinity of the through hole TH may be minimized. Accordingly, the manufacturing cost and time are saved so that the process efficiency may be improved.

Specifically, in the display device 400 according to still another example embodiment of the present disclosure, the base film 422 of the adhesive layer 420 includes the scattering particles. Therefore, light emitted from the light emitting diode of the display panel 140 is reflected or scatted by the scattering particles of the base film 422 to improve light extraction efficiency.

The example embodiments of the present disclosure can also be described as follows:

According to an aspect of the present disclosure, there is provided a display device. The display device includes a display panel which includes an active area including an optical area with a through hole disposed therein and a non-active area enclosing the active area, a cover member disposed on the display panel, a first adhesive layer which is disposed between the display panel and the cover member and includes a variable adhesion material, a base film disposed between the first adhesive layer and the display panel and a second adhesive layer disposed between the base film and the display panel.

The first adhesive layer may include an additive and the additive may be an anti-adhesion agent.

The additive may be formed of a hydrophobic polymer material.

The base film may include scattering particles and an organic material in which the scattering particles are dispersed.

The first adhesive layer, the base film, and the second adhesive layer may be disposed so as to enclose the through hole.

The display panel may further include an inner bezel area which is disposed so as to enclose the through hole, and the first adhesive layer, the base film, and the second adhesive layer may be disposed so as to overlap the inner bezel area.

The display device may further include a third adhesive layer which is disposed between the display panel and the cover member and encloses the inner bezel area. An adhesive strength of the third adhesive layer may be fixed.

Ends of the first adhesive layer, the base film, and the second adhesive layer may overlap an end of the display panel.

An adhesive strength of the second adhesive layer may be fixed.

Although the example embodiments of the present disclosure have been described in detail with reference to the accompanying drawings, the present disclosure is not limited thereto and may be embodied in many different forms without departing from the technical concepts of the present disclosure. Therefore, the example embodiments of the present disclosure are provided for illustrative purposes only but not intended to limit the technical concepts of the present disclosure. The scope of the technical concepts of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

What is claimed is:

1. A display device, comprising:

a display panel which includes an active area including an optical area with a through hole disposed therein and a non-active area enclosing the active area;

a cover member disposed on the display panel;

a first adhesive layer which is disposed between the display panel and the cover member and includes a variable adhesion material with a variable adhesive strength;

a base film disposed between the first adhesive layer and the display panel;

a second adhesive layer disposed between the base film and the display panel; and a third adhesive layer disposed in an area different from an area in which the first adhesive layer, the base film, and the second adhesive layer are disposed, wherein the third adhesive layer is disposed on side surfaces of the first adhesive layer, the base film and the second adhesive layer, and an adhesive strength of the third adhesive layer is fixed.

2. The display device according to claim 1, wherein the first adhesive layer includes an additive, and the additive is an anti-adhesion agent.

3. The display device according to claim 2, wherein the additive is formed of a hydrophobic polymer material.

4. The display device according to claim 1, wherein the base film includes scattering particles and an organic material in which the scattering particles are dispersed.

5. The display device according to claim 1, wherein the first adhesive layer, the base film, and the second adhesive layer are disposed so as to enclose the through hole.

6. The display device according to claim 5, wherein the display panel further includes an inner bezel area which is disposed so as to enclose the through hole, and the first adhesive layer, the base film, and the second adhesive layer are disposed so as to overlap the inner bezel area.

7. The display device according to claim 6, wherein the third adhesive layer which is disposed between the display panel and the cover member and encloses the inner bezel area.

8. The display device according to claim 1, wherein ends of the first adhesive layer, the base film, and the second adhesive layer overlap an end of the display panel.

9. The display device according to claim 1, wherein an adhesive strength of the second adhesive layer is fixed.

* * * * *